(12) United States Patent
Liu

(10) Patent No.: US 11,942,559 B2
(45) Date of Patent: Mar. 26, 2024

(54) METHOD OF PREVENTING TFT FROM ESD DAMAGING, METHOD OF MANUFACTURING TFT, AND DISPLAY PANEL

(71) Applicant: Shenzhen China Star Optoelectronics Semiconductor Display Technology Co., Ltd., Guangdong (CN)

(72) Inventor: Junzheng Liu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/600,281

(22) PCT Filed: Aug. 19, 2021

(86) PCT No.: PCT/CN2021/113482
§ 371 (c)(1),
(2) Date: Sep. 30, 2021

(87) PCT Pub. No.: WO2023/015591
PCT Pub. Date: Feb. 16, 2023

(65) Prior Publication Data
US 2024/0021732 A1     Jan. 18, 2024

(30) Foreign Application Priority Data

Aug. 10, 2021 (CN) .......................... 202110912249.X

(51) Int. Cl.
*G06T 7/00*     (2017.01)
*H01L 27/02*     (2006.01)
(Continued)

(52) U.S. Cl.
CPC ...... *H01L 29/78696* (2013.01); *H01L 27/027* (2013.01); *H01L 27/1233* (2013.01)

(58) Field of Classification Search
CPC ............ H01L 29/78696; H01L 27/027; H01L 27/1233; H01L 27/0248; H01L 27/0288;
(Continued)

(56) References Cited

U.S. PATENT DOCUMENTS

| | | | |
|---|---|---|---|
| 2005/0065762 A1 | 3/2005 | Hayashi | |
| 2016/0125582 A1* | 5/2016 | Adams ................... | G09G 3/006 382/141 |

(Continued)

FOREIGN PATENT DOCUMENTS

| | | |
|---|---|---|
| CN | 105280633 | 1/2016 |
| CN | 107330200 | 11/2017 |

(Continued)

OTHER PUBLICATIONS

International Search Report and the Written Opinion dated Jun. 10, 2022 From the International Searching Authority Re. Application No. PCT/CN2021/113482 and Its Translation Into English. (17 Pages).

*Primary Examiner* — Hoan C Nguyen

(57) ABSTRACT

The present application provides a method of preventing thin film transistor (TFT) from electrostatic discharge (ESD) damaging, a method of manufacturing a TFT, and a display panel. By fitting a test data, acquiring relationships between an anti-ESD capability of the TFT and manufacturing parameters of each film layer, according to above-mentioned relationships, disposing the manufacturing parameters of each film layer of the TFT, to prevent the TFT from ESD damaging.

17 Claims, 4 Drawing Sheets

(51) Int. Cl.
*H01L 27/12* (2006.01)
*H01L 29/24* (2006.01)
*H01L 29/786* (2006.01)

(58) Field of Classification Search
CPC H01L 27/0292; G09G 2330/04; G09G 3/006; G02F 1/136204; G02F 1/136286
See application file for complete search history.

(56) References Cited

U.S. PATENT DOCUMENTS

| | | | |
|---|---|---|---|
| 2017/0186843 A1* | 6/2017 | Hosaka | C04B 35/01 |
| 2018/0100890 A1* | 4/2018 | Duvvury | G01R 31/002 |

FOREIGN PATENT DOCUMENTS

| | | | | |
|---|---|---|---|---|
| CN | 107406966 A | * | 11/2017 | ......... H01L 27/1225 |
| CN | 107895942 A | * | 4/2018 | ............. H02H 9/045 |
| CN | 107978610 A | * | 5/2018 | ........... G09G 3/3225 |
| CN | 108365013 | | 8/2018 | |
| CN | 110634843 | | 12/2019 | |
| CN | 110634843 A | * | 12/2019 | ............. H01L 23/60 |
| JP | 2008129374 A | * | 6/2008 | ....... G02F 1/136204 |

\* cited by examiner

METHOD OF PREVENTING TFT FROM ESD DAMAGING, METHOD OF MANUFACTURING TFT, AND DISPLAY PANEL

RELATED APPLICATIONS

This application is a National Phase of PCT Patent Application No. PCT/CN2021/113482 having International filing date of Aug. 19, 2021, which claims the benefit of priority of Chinese Patent Application No. 202110912249.X filed on Aug. 10, 2021. The contents of the above applications are all incorporated by reference as if fully set forth herein in their entirety.

FIELD AND BACKGROUND OF THE INVENTION

The present application relates to a field of display technology, in particular to a method of preventing thin-film transistor from electrostatic damaging, a method of manufacturing TFT, and a display panel.

Electro-static discharge (ESD), that is, a discharge phenomenon caused by contact or induction due to an unequal potential difference between two objects.

ESD exists in the environment, and is discharge passes through the circuit, wherein when the current pulse cannot be dredged by the circuit with protection, an instantaneous current will raise an internal temperature of the material to the melting point, thus causes component damage. The main factors that affect a magnitude of the static electricity are the mixing of impurities, the conductivity of impurities is high, the amount of static electricity is low, and a contact area and pressure of the surface state is big, that is, the larger the contact region. The higher the static electricity, the greater the pressure, the higher the static electricity, the faster the separation speed; the higher the electrostatic charge, the components will easily undergo drastic changes and failure due to ESD impact. The component may be completely destroyed, no longer functions, and be permanent failed by ESD impact. The ESD may melt the metal, destroy the display interface, and destroy the dielectric layer, wherein the ESD is usually caused by high-energy-density discharge in a local region of the device. Components affected by ESD may have potential defects, wherein this type of defect is more difficult to detect, and the component is partially damaged and has a certain degree of deterioration, although the components still has a normal function, its life cycle is significantly shorter. If there is such a component in the system, it will often be scrapped early. For TFT LCD, the damage of ESD will cause the defect of line of array area (AA), and also cause a black screen and defect of line of gate on array (GOA).

SUMMARY OF THE INVENTION

The present application provides a method of preventing TFTs from ESD damaging, a method of manufacturing TFTs, and a display panel, so as to solve the technical problems in the prior art that electronic components are damaged due to electrostatic discharge and shorten the service life.

In order to achieve the above objective, the present application provides a method of preventing thin-film transistor (TFT) from electrostatic discharge (ESD) damaging, including following steps:

acquiring a test data of at least one film layer of a plurality of TFTs, the test data comprising manufacturing parameters of each film layer and electrostatic discharge voltages that each film layer can withstand;

data fitting the test data to obtain at least one fitting curve; and acquiring a relationship between an anti-ESD capability of the TFT and the manufacturing parameters of each film layer from the fitting curve.

Further, the manufacturing parameters comprises a ramp angle of a gate layer of the TFT, and the ramp angle of the gate layer of the TFT ranges from 0° to 40°.

Further, the smaller the ramp angle of the gate layer, the better an ESD resistance of the TFT.

Further, the manufacturing parameters include a thickness of the gate insulating layer of the TFT, and the greater the thickness of the gate insulating layer, the better an ESD resistance of the TFT.

Further, the gate insulating layer is made of inorganic material.

Further, the TFT includes: a gate layer, a gate insulating layer, and an active layer; and wherein a thickness of a first metal layer is d0, an angle of the ramp angle of the gate layer is A, a sum of thicknesses of the gate insulating layer and the active layer at a slope top of the gate layer is d1, a sum of thicknesses of the gate insulating layer and the active layer at a ramp of the gate layer is d2, and a sum of the thicknesses of the gate insulating layer and the active layer at a bottom of the gate layer is d3, wherein $d2=0.773*d3+0.156*d3*\cos A-0.061*d0$.

Further, the electrostatic discharge voltage is an average value of an actual electrostatic discharge voltage that the same film layer of the plurality of TFTs can withstand.

Further, the test data further comprises a damage ratio or a good ratio of the plurality of TFTs;

the damage ratio is a ratio of a number of TFTs damaged by the electrostatic discharge voltage to the total number of the plurality of TFTs;

the good ratio is a ratio of a number of TFTs that are not damaged by the electrostatic discharge voltage to the total number of the plurality of TFTs.

In order to achieve the above objective, the present application also provides a method of manufacturing a TFT, which includes disposing the manufacturing parameters of the film layer of the TFT according to the relationship between the anti-ESD ability of the TFT and the manufacturing parameters of each film layer obtained in the method of preventing the element from ESD damage of the present application.

In order to achieve the above objective, the present application also provides a display panel, which includes a TFT, and the TFT is manufactured by the TFT manufacturing method of the present application.

The present invention provides a method of preventing TFT from ESD from damaging, a method of manufacturing TFT, and a display panel. By fitting test data, the relationship between the anti-ESD ability of TFT and the preparation parameters of each film layer is obtained. The angle range of the ramp angle of the gate layer is 0°-40°, and the smaller the angle of the ramp angle of the gate layer, the stronger the ESD resistance of the TFT, the larger the value of the thickness of the gate insulating layer, the stronger the ESD resistance of the TFT. According to the above relationship, the manufacturing parameters of each film layer of the TFT are disposed to prevent TFT from ESD damage which cause line defects in the AA area, black screen and line defects in the GOA area, etc.

BRIEF DESCRIPTION OF THE SEVERAL VIEWS OF THE DRAWINGS

The technical solutions and other beneficial effects of the present application will be made obvious by describing in detail the specific embodiments of the present application in conjunction with the accompanying figures.

DESCRIPTION OF SPECIFIC EMBODIMENTS OF THE INVENTION

The technical solutions in the embodiments of the present application will be clearly and completely described below in conjunction with the accompanying figures in the embodiments of the present application. Obviously, the described embodiments are only a part of the embodiments of the present application, rather than all the embodiments. Based on the embodiments of the present application, all other embodiments obtained by those skilled in the art without inventive steps shall fall within a protection scope of the present application.

Figure 1:
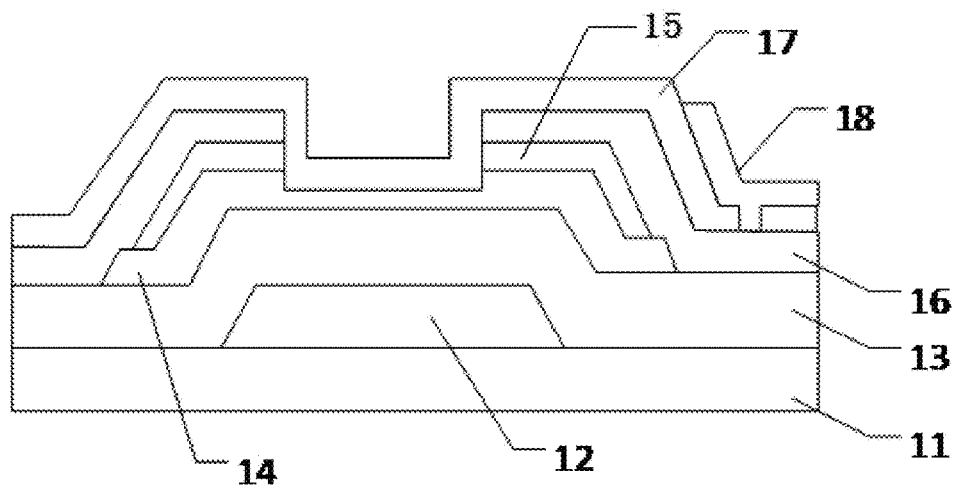
FIG. 1 is a schematic diagram of a structure of a TFT provided by the present application.

As shown in FIG. 1, the present application provides a method of preventing TFT from ESD damaging, including following steps:

S1. acquiring a test data of at least one film layer of a plurality of TFTs, the test data including manufacturing parameters of each film layer and electrostatic discharge voltages that each film layer can withstand. The electrostatic discharge voltage is an average value of the actual electrostatic discharge voltage that the same film layer of a plurality of TFTs can withstand. In the test data, the same film layer corresponds to multiple sets of manufacturing parameters and a plurality of voltage thresholds, wherein the voltage threshold is a maximum electrostatic discharge voltage can be withstood.

As shown in FIG. 1, the TFT includes a substrate 11, a gate layer 12, a gate insulating layer 13, an active layer 14, an ohmic contact layer 15, a source and drain electrode layer 16, an insulating protection layer 17, and a pixel electrode 18 stacked in sequence.

S2. Data fitting the test data to obtain at least one fitting curve. Data fitting is also called curve fitting, commonly known as pull curve. It is a way of substituting existing data into a numerical formula through mathematical methods. Scientific and engineering problems can obtain a number of discrete data through methods such as sampling and experiments. Based on these data, we often hope to obtain a continuous function, that is a curve, or a denser discrete equation that is consistent with the known data. This process It is called fitting. In this embodiment of the present application, it is a linear fitting, and in other embodiments of the present application, it may also be least square fitting.

S3. Acquiring a relationship between an anti-ESD capability of the TFT and the manufacturing parameters of each film layer from the fitting curve.

Figure 2:
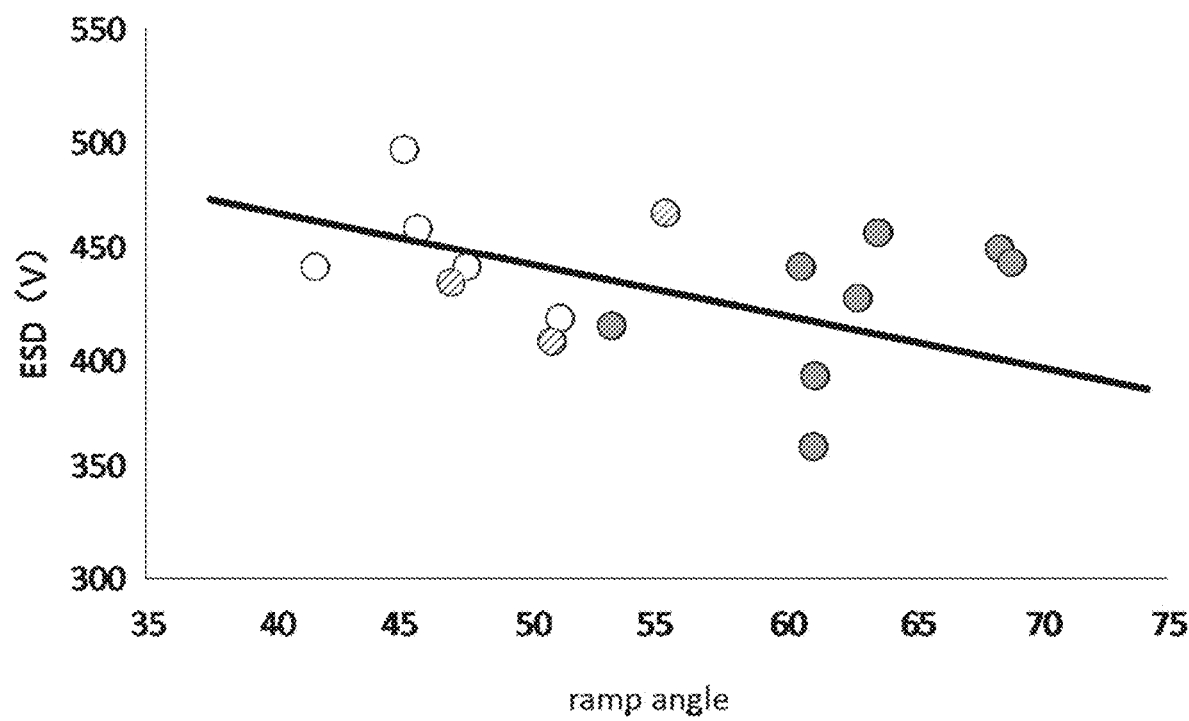
FIG. 2 is a schematic diagram of fitting the ramp angle of the gate layer to an ESD data according to one embodiment of the present application.

In one embodiment, as shown in FIG. 2, the circle without filling means that a thickness of the gate layer 12 is 7000 angstroms, and the circle stripe filling means that the thickness of the gate layer 12 is 4000 angstroms, when the manufacturing parameter is only the ramp angle of the gate layer 12, when the ramp angle of the gate layer 12 ranges from 0° to 70°, the larger the angle of the ramp angle, the smaller the electrostatic discharge voltage the TFT can withstood, the smaller the ESD resistance.

Figure 3:
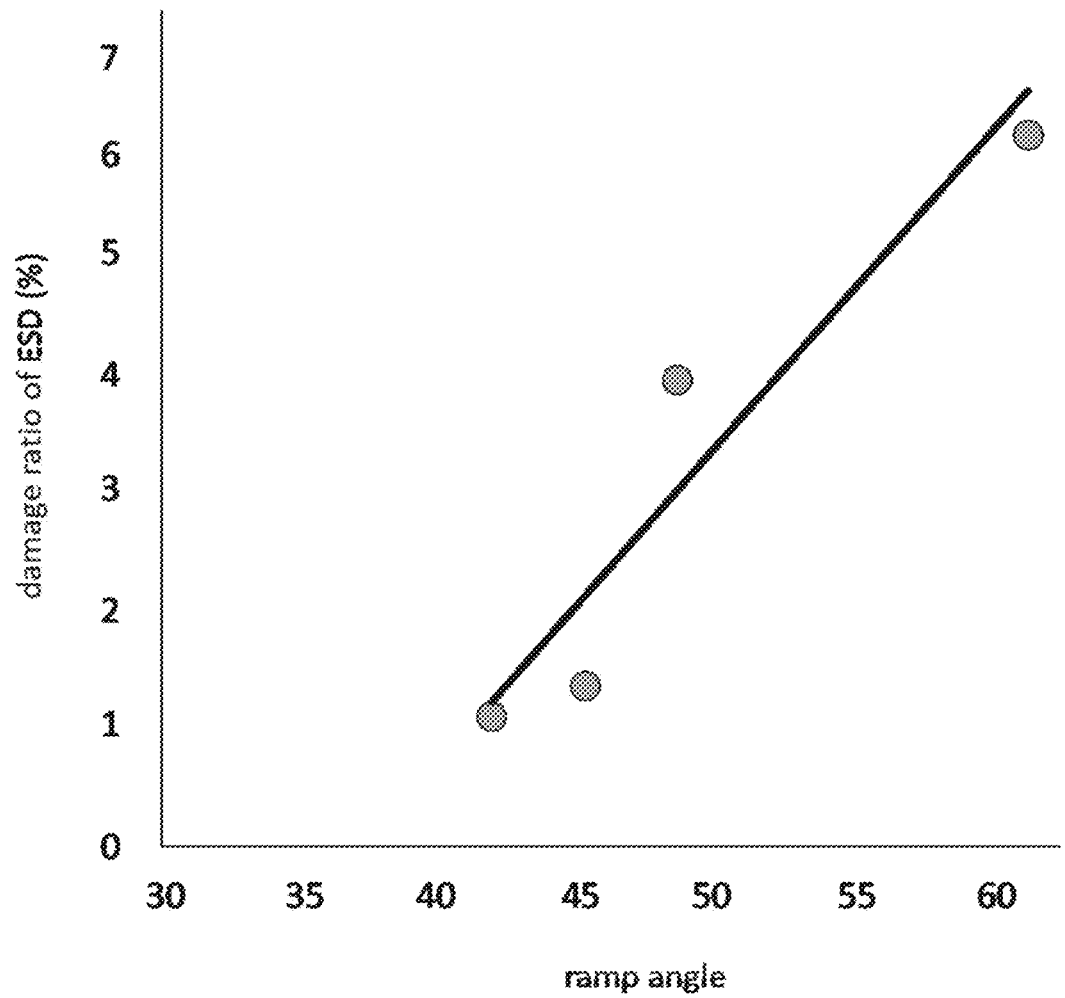
FIG. 3 is a schematic diagram of fitting the ramp angle of the gate layer and an ESD damage data according to one embodiment of the present application.

The test data also includes a damage ratio or a good ratio of the plurality of TFTs, the damage ratio is a ratio of a number of TFTs damaged by the electrostatic discharge voltage to the to a total number of the plurality of TFTs, the good ratio is a ratio of a number of TFTs that are not damaged by the electrostatic discharge voltage to the total number of the plurality of TFTs. Referring to FIG. 3, FIG. 3 discloses the ordinate is changed to the damage ratio. It can be seen from FIG. 3 that when the ramp angle of the gate layer is greater than 40°, the greater the ramp angle of the gate layer, the greater the damage ratio of the TFT, so when the ramp angle of the layer ranges from 0° to 40°, and the smaller the ramp angle of the gate layer, the better the ESD resistance of the TFT.

Figure 4:
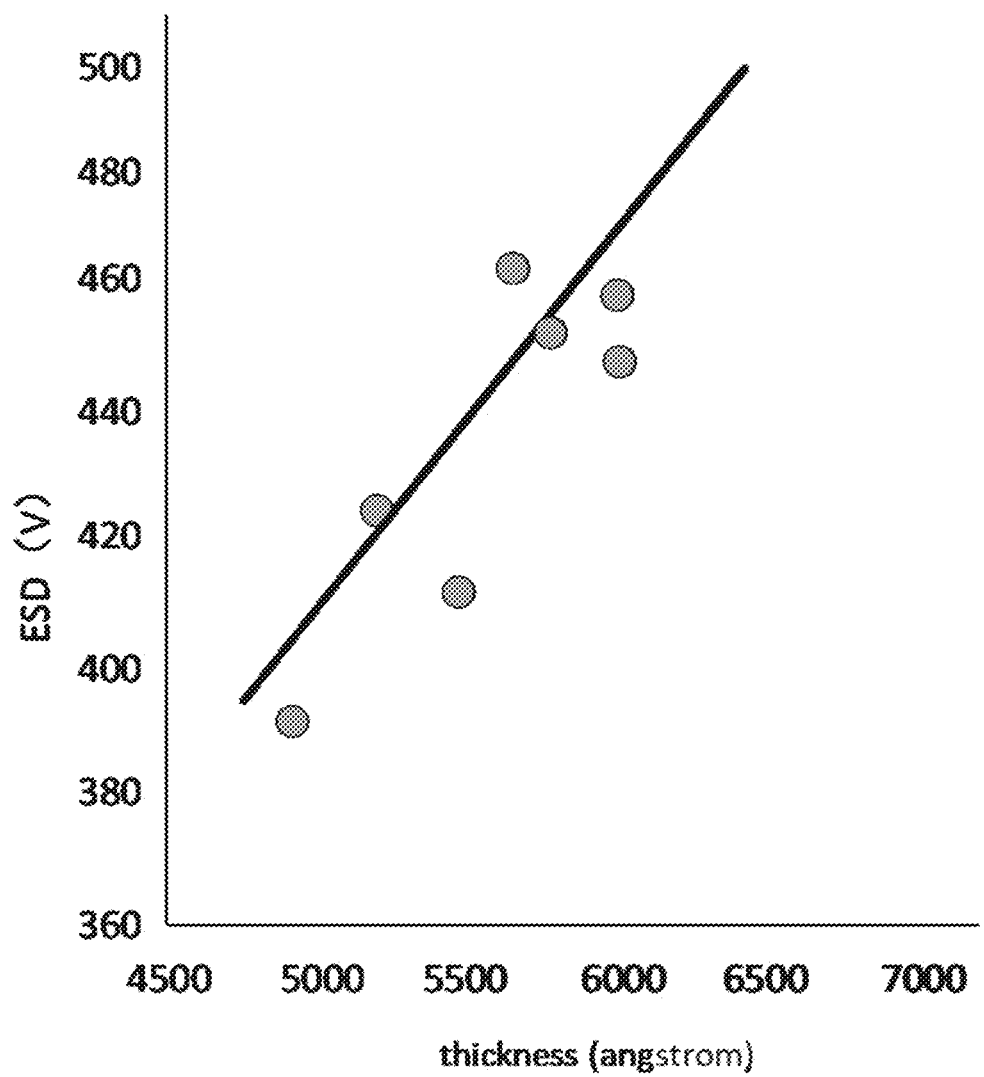
FIG. 4 is a schematic diagram of fitting thickness of a gate insulating layer to an ESD data according to one embodiment of the present application.

As shown in FIG. 4, in one embodiment, when the manufacturing parameter is only the thickness of the gate insulating layer 13, the thicker the thickness of the gate insulating layer 13, the greater the electrostatic discharge voltage the TFT can withstand, that is, the better the ESD resistance of the TFT. A material of the gate insulating layer 13 is an inorganic material. In this embodiment, the gate insulating layer 13 includes a first gate insulating layer (not shown) and a second gate insulating layer (not shown). The second gate insulating layer is disposed on the first gate insulating layer.

Figure 5:
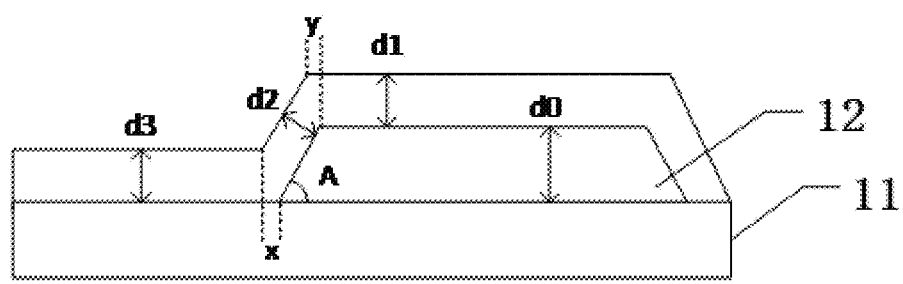
FIG. 5 is a schematic diagram of d0, d1, d2, d3, and A provided by one embodiment of the present application.
Figure 6:
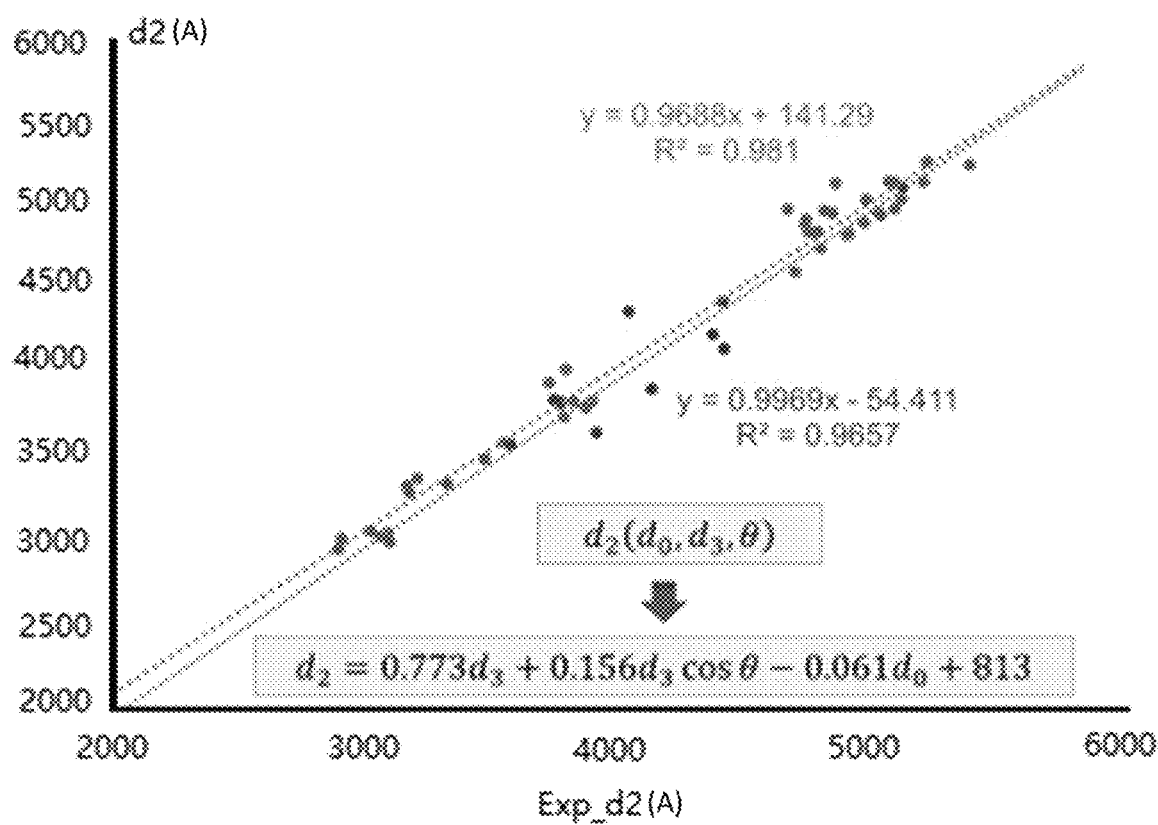
FIG. 6 is a schematic diagram of data fitting of d0, d1, d3, A, and d2 provided by one embodiment of the present application.

As shown in FIGS. 5 and 6, a thickness of the gate layer 12 is d0, an angle of the ramp angle of the gate layer 12 is A, a sum of thicknesses of the gate insulating layer 13 and the active layer 14 at a slope top of the gate layer 12 is d1, a sum of thicknesses of the gate insulating layer 13 and the active layer 14 at a ramp of the gate layer 12 is d2, and a sum of the thicknesses of the gate insulating layer 13 and the active layer 14 at a bottom of the gate layer is d3, wherein $d2=0.773*d3+0.156*d3*\cos A-0.061*d0$.

The present application provides a method of preventing TFTs from ESD damaging, by fitting the test data, the relationship between the anti-ESD ability of TFTs and the manufacturing parameters of each film layer is acquired, that is, the ramp angle A of the gate layer 12 ranges from 0° to 40°, the smaller the angle of the ramp angle A of the gate layer 12, the better the ESD resistance of the TFT, the thicker the thickness of the gate insulating layer 13, the better the anti-ESD ability of the TFT.

The present application also provides a method of manufacturing a TFT, which includes setting manufacturing parameters of each film layer of the TFT according to a relationship between an anti-ESD capability of the TFT and the manufacturing parameters of each film layer obtained in the method of preventing components from ESD damaging of the present application. That is, the manufacturing parameters of the TFT film layer are set according to a relationship between the ESD and the film layer of the TFT, so as to prevent the TFT from ESD damaging.

The present application also provides a display panel, which includes a TFT, and the TFT is manufactured by the TFT manufacturing method of the present application.

Specific examples are used in the specification to illustrate the principles and embodiments of the present application. The descriptions of the above embodiment are only used to help understand the technical solutions and core ideas of the present application. Those of ordinary skill in the art should understand that they can still modify the technical solutions recorded in the foregoing embodiments, or equivalently replace some of the technical features. However, these modifications or replacements do not cause the essence of the corresponding technical solutions to deviate from a scope of the technical solutions of the embodiments of the present application.

What is claimed is:

1. A method of preventing thin-film transistor (TFT) from electrostatic discharge (ESD) damaging, comprising following steps:
    acquiring a test data of at least one film layer of a plurality of TFTs, the test data comprising manufacturing parameters of each film layer and electrostatic discharge voltages that each film layer can withstand;
    data fitting the test data to obtain at least one fitting curve; and
    acquiring a relationship between an anti-ESD capability of the TFT and the manufacturing parameters of each film layer from the fitting curve.

2. The method of preventing TFT from ESD damaging according to claim 1, wherein the manufacturing parameters comprises a ramp angle of a gate layer of the TFT, and the ramp angle of the gate layer of the TFT ranges from 0° to 40°.

3. The method of preventing TFT from ESD damaging according to claim 2, wherein the smaller the ramp angle of the gate layer, the better an ESD resistance of the TFT.

4. The method of preventing TFT from ESD damaging according to claim 1, wherein the manufacturing parameters include a thickness of the gate insulating layer of the TFT, and the greater the thickness of the gate insulating layer, the better an ESD resistance of the TFT.

5. The method of preventing TFT from ESD damaging of claim 4, wherein the gate insulating layer is made of inorganic material.

6. The method of preventing TFT from ESD damaging of claim 1, wherein the TFT comprises: a gate layer, a gate insulating layer, and an active layer; and
    wherein a thickness of a first metal layer is d0, an angle of the ramp angle of the gate layer is A, a sum of thicknesses of the gate insulating layer and the active layer at a slope top of the gate layer is d1, a sum of thicknesses of the gate insulating layer and the active layer at a ramp of the gate layer is d2, and a sum of the thicknesses of the gate insulating layer and the active layer at a bottom of the gate layer is d3, wherein $d2=0.773*d3+0.156*d3*cosA-0.061*d0$.

7. The method of preventing TFT from ESD damaging of claim 1, wherein the electrostatic discharge voltage is an average value of an actual electrostatic discharge voltage that the same film layer of the plurality of TFTs can withstand.

8. The method of preventing TFT from ESD damaging of claim 1, wherein the test data further comprises a damage ratio or a good ratio of the plurality of TFTs;
    the damage ratio is a ratio of a number of TFTs damaged by the electrostatic discharge voltage to a total number of the plurality of TFTs;
    the good ratio is a ratio of a number of TFTs that are not damaged by the electrostatic discharge voltage to the total number of the plurality of TFTs.

9. A method of manufacturing a TFT, comprising: setting manufacturing parameters of each film layer of the TFT according to a relationship between an anti-ESD capability of the TFT and the manufacturing parameters of each film layer obtained in a method of preventing TFT from ESD damaging;
    wherein the method of preventing TFT from ESD damaging comprises following steps:
    acquiring a test data of at least one film layer of a plurality of TFTs, the test data comprising manufacturing parameters of each film layer and electrostatic discharge voltages that each film layer can withstand;
    data fitting the test data to obtain at least one fitting curve; and
    acquiring a relationship between an anti-ESD capability of the TFT and the manufacturing parameters of each film layer from the fitting curve.

10. The method of manufacturing the TFT according to claim 9, wherein the manufacturing parameters comprises a ramp angle of a gate layer of the TFT, and the ramp angle of the gate layer of the TFT ranges from 0° to 40°.

11. The method of manufacturing the TFT according to claim 10, wherein the smaller the ramp angle of the gate layer, the better an ESD resistance of the TFT.

12. The method of manufacturing the TFT according to claim 9, wherein the manufacturing parameters include a thickness of the gate insulating layer of the TFT, and the greater the thickness of the gate insulating layer, the better an ESD resistance of the TFT.

13. The method of manufacturing the TFT according to claim 12, wherein the gate insulating layer is made of inorganic material.

14. The method of manufacturing the TFT according to claim 9, wherein the TFT comprises: a gate layer, a gate insulating layer, and an active layer; and
    wherein a thickness of a first metal layer is d0, an angle of the ramp angle of the gate layer is A, a sum of thicknesses of the gate insulating layer and the active layer at a slope top of the gate layer is d1, a sum of thicknesses of the gate insulating layer and the active layer at a ramp of the gate layer is d2, and a sum of the thicknesses of the gate insulating layer and the active layer at a bottom of the gate layer is d3, wherein $d2=0.773*d3+0.156*d3*cosA-0.061*d0$.

15. The method of manufacturing the TFT according to claim 9, wherein the electrostatic discharge voltage is an average value of an actual electrostatic discharge voltage that the same film layer of a plurality of TFTs can withstand.

16. The method of manufacturing the TFT according to claim 9, wherein the test data further comprises a damage ratio or a good ratio of the plurality of TFTs;
    the damage ratio is a ratio of a number of TFTs damaged by the electrostatic discharge voltage to the total number of the plurality of TFTs;
    the good ratio is a ratio of a number of TFTs that are not damaged by the electrostatic discharge voltage to the total number of the plurality of TFTs.

17. A display panel, comprising a TFT manufactured by the TFT manufacturing method of claim 9.

* * * * *